United States Patent
Budzelaar (10) Patent No.: US 7,271,756 B2
(45) Date of Patent: Sep. 18, 2007

(54) NON-LINEAR DISTRIBUTION OF VOLTAGE STEPS IN FLASH-TYPE A/D CONVERTERS

(75) Inventor: Franciscus Paulus Maria Budzelaar, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/537,670

(22) PCT Filed: Nov. 28, 2003

(86) PCT No.: PCT/IB03/05507

§ 371 (c)(1),
(2), (4) Date: Jun. 6, 2005

(87) PCT Pub. No.: WO2004/051858

PCT Pub. Date: Jun. 17, 2004

(65) Prior Publication Data

US 2006/0125672 A1    Jun. 15, 2006

Related U.S. Application Data

(60) Provisional application No. 60/430,920, filed on Dec. 4, 2002.

(51) Int. Cl.
*H03M 1/12* (2006.01)

(52) U.S. Cl. .................................. 341/155; 341/159
(58) Field of Classification Search ................ 341/155, 341/159, 160, 170
See application file for complete search history.

(56) References Cited

U.S. PATENT DOCUMENTS

| | | | | |
|---|---|---|---|---|
| 4,990,917 A | * | 2/1991 | Kohdaka | 341/159 |
| 5,059,980 A | * | 10/1991 | Katzenstein | 341/159 |
| 5,066,952 A | | 11/1991 | Koerner | 341/138 |
| 5,309,157 A | * | 5/1994 | Yee | 341/156 |
| 5,801,657 A | * | 9/1998 | Fowler et al. | 341/155 |

FOREIGN PATENT DOCUMENTS

| | | |
|---|---|---|
| EP | 0 332 118 A | 9/1989 |
| EP | 0 399 303 A | 11/1990 |

* cited by examiner

*Primary Examiner*—Peguy JeanPierre
(74) *Attorney, Agent, or Firm*—Peter Zawilski (57) ABSTRACT

A method, apparatus, and system for converting an input voltage VIN to a digital output. A comparison of VIN with reference voltages in one or more flash-type analog-to-digital (A/D) converters generates the digital output representing VIN. If one A/D converter is used, the A/D converter is non-linear. If more than one A/D converter are used, the A/D converters are each linear.

14 Claims, 7 Drawing Sheets

NON-LINEAR DISTRIBUTION OF VOLTAGE STEPS IN FLASH-TYPE A/D CONVERTERS

This application is a 371 of PCT/IB03/05507 filed on Nov. 28, 2003 which claims benefit of Ser. No. 60/430,920 filed on Dec. 4, 2002. The present invention relates to a method, apparatus, and system for converting an input voltage to a digital output.

Current flash-type analog-to-digital (A/D) converters are characterized by high relative error at low input voltage. Accordingly, there is a need for a method, apparatus, and system that efficiently reduces the relative error in the digital output of a flash-type A/D converter at low input voltage.

In first embodiments, the present invention provides a flash-type analog-to-digital (A/D) converter, said A/D converter adapted to convert an input voltage VIN to a digital output, wherein VIN is within a working voltage range of the A/D converter, said working voltage range defined by a lowest voltage VREF− and a highest voltage VREF+, said A/D converter comprising:

N reference voltages V1, V2, ..., VN non-linearly distributed between VREF− and VREF+ and ordered according to VREF−<V1<V2< ... <VN<VREF+, wherein N is at least 3;

N comparators associated with said N reference voltages on a one-to-one basis, each comparator adapted to make a comparison between VIN and the reference voltage that is associated with said comparator, each comparator adapted to generate a binary bit that reflects a binary result of said comparison; and encoder means for generating the digital output from an analysis of the binary bits generated by said comparators.

In second embodiments, the present invention provides a method for converting an input voltage VIN to a digital output such that VIN falls between a lowest voltage VREF− to a maximum voltage VREF+, said method comprising:

providing N reference voltages V1, V2, ..., VN non-linearly distributed between VREF− and VREF+ and ordered according to VREF−<V1<V2< ... <VN<VREF+, wherein N is at least 3;

comparing VIN with each of the N reference voltages;

generating a binary bit for each said comparisons; said binary bit reflecting a binary result of said comparison; and generating the digital output from an analysis of the generated binary bits.

In third embodiments, the present invention provides a system for converting an input voltage VIN to a digital output, comprising:

K linear flash-type analog-to-digital (A/D) converter apparatuses Z1, Z2, ..., ZK respectively characterized by reference voltage step sizes $\Delta V1, \Delta V2, ..., \Delta VK$ and respectively adapted to convert VIN into multibit strings S1, S2, ..., SK, wherein $\Delta V1<\Delta V2< ... <\Delta VK$, and wherein $K \geq 2$; and encoder means for combining S1, S2, ..., and SK to generate the digital output, wherein the digital output has a sufficient number of bits to preserve the accuracy that is contained within S1, S2, ..., and SK.

In fourth embodiments, the present invention provides a method for converting an input voltage VIN to a digital output, comprising:

providing K linear flash-type analog-to-digital (A/D) converter apparatuses Z1, Z2, ..., ZK respectively characterized by reference voltage step sizes $\Delta V1, \Delta V2, ..., \Delta VK$, wherein $\Delta V1<\Delta V2< ... <\Delta VK$, and wherein $K \geq 2$;

converting VIN, by converter apparatuses Z1, Z2, ..., ZK, into multibit strings S1, S2, ..., SK, respectively; and combining S1, S2, ..., and SK to generate the digital output, wherein the digital output has a sufficient number of bits to preserve the accuracy that is contained within S1, S2, ..., and SK.

The present invention provides a method, apparatus, and system that efficiently reduces the relative error in the digital output of a flash-type A/D converter at low input voltage.

Figure 1:
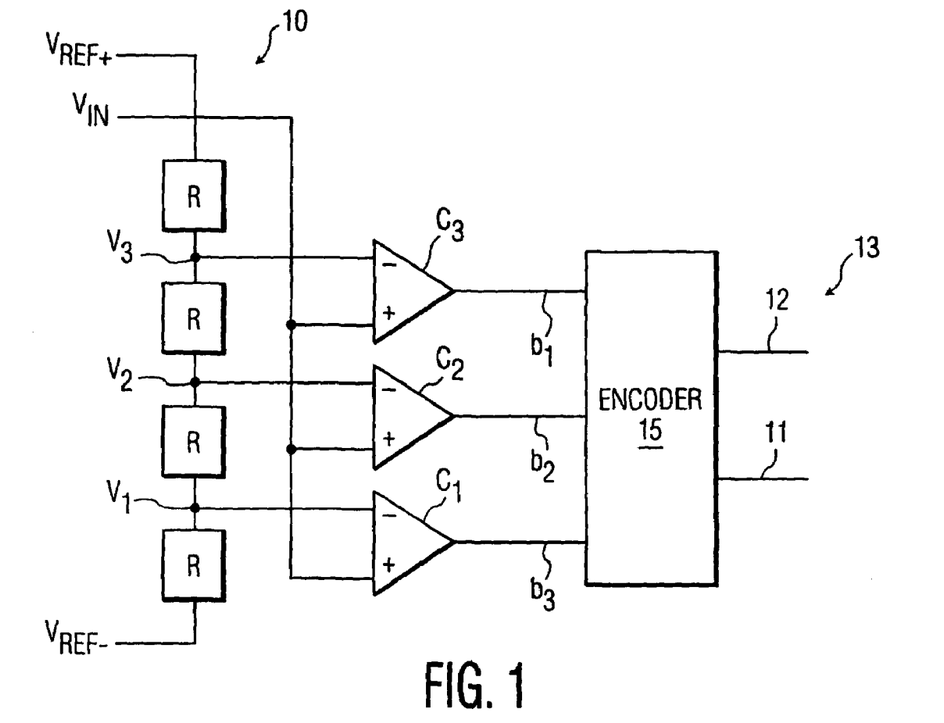
FIG. 1 depicts a linear flash-type analog-to-digital (A/D) converter, in accordance with embodiments of the present invention.

A flash-type analog-to-digital (A/D) converter comprises an array of comparators that compares an analog input voltage with a set of reference voltages. There is an associated set of voltage steps between the reference voltages. The output values from the comparators are combined into a digital value that has a direct relation with the analog input voltage. With a linear flash-type A/D, the reference voltages are linearly distributed and the voltage steps are constant. With a non-linear flash-type A/D, the reference voltages are non-linearly distributed and the voltage steps are not constant FIG. 1 depicts a linear analog-to-digital (A/D) converter 10 having a two-bit digital output code 13, as determined from the output bits 11 and 12 each containing a binary bit of 0 or 1, in accordance with embodiments of the present invention. The output code 13 (bit 11, bit 12) is sequenced from left to right. For example, if bit 11 and bit 12 respectively contain 1 and 0, then the output code 13 is 10 b (binary), which is equivalent to 2 d (decimal). Being a linear converter, the A/D converter 10 comprises four equal resistors in series, each having a same resistance R, between a lowest voltage VREF− and a highest voltage VREF+. Thus, the four resistances are linearly distributed between the lowest voltage VREF− and the highest voltage VREF+. This defines three reference voltages V1, V2, and V3 and four voltage steps such that VREF−<V1<V2< . . . <VN<VREF+. The four voltage steps of (V1−VREF−), (V2−V1), (V3−V2), and (VREF+−V3) are equal to each other due to the linearity of the A/D converter 10, and the three reference voltages V1, V2, and V3 are said to be linearly distributed between the lowest voltage VREF− and the highest voltage VREF+.

The linear A/D converter 10 further comprises three comparators C1, C2, and C3, respectively associated with the three reference voltages V1, V2, and V3. The comparator C1 compares the input voltage VIN with the reference voltage V1 and outputs a binary bit b1 that reflects the result of said comparison (e.g., b1=0 if VIN<V1 and b1=1 if VIN$^3$ V1). The comparator C2 compares the input voltage VIN with the reference voltage V2 and outputs a binary bit b2 that reflects the result of said comparison (e.g., b2=0 if VIN<V2 and b2=1 if VIN $^3$ V2). The comparator C3 compares the input voltage VIN with the reference voltage V3 and outputs a binary bit b3 that reflects the result of said comparison (e.g., b3=0 if VIN<V3 and b3=1 if VIN$^3$ V3).

Figure 2:
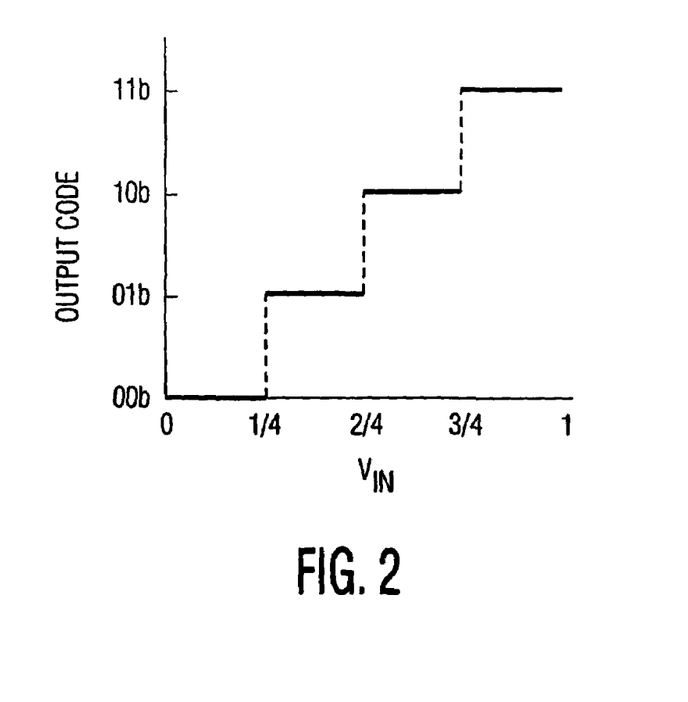
FIG. 2 depicts digital output versus input voltage for the linear A/D converter of FIG. 1, in accordance with embodiments of the present invention.

The linear A/D converter 10 additionally comprises an encoder 15 which generates the output code 13 defined by the bits 11 and 12, from an analysis of bits b1, b2, and b3. The output code 13 may have one of four possible values, namely 00 b, 10 b, 01 b, and 11 b, wherein "b" stands for binary, as shown in FIG. 2 in accordance with embodiments of the present invention. FIG. 2 is a plot of output code 13 versus the input voltage VIN and assumes that VIN is defined over a range from 0 to 1 (i.e., VREF−=0 and VREF+=1). Accordingly, FIG. 2 shows the four equal voltage steps from 0 to ¼, from ¼ to ½, from ½ to ¾, and from ¾ to 1. The four output codes are summarized in Table 1, wherein "b" and "d" in the "Output Code" column stand for binary and decimal, respectively.

TABLE 1

| Output Code | Range of VIN | Equivalent Range of VIN |
|---|---|---|
| 00b = 0d | 0 £ VIN < ¼ | VIN = ⅛ ± ⅛ |
| 01b = 1d | ¼ £ VIN < ½ | VIN = ⅜ ± ⅛ |
| 10b = 2d | ½ £ VIN < ¾ | VIN = ⅝ ± ⅛ |
| 11b = 3d | ¾ £ VIN < 1 | VIN = ⅞ ± ⅛ |

Figure 3:
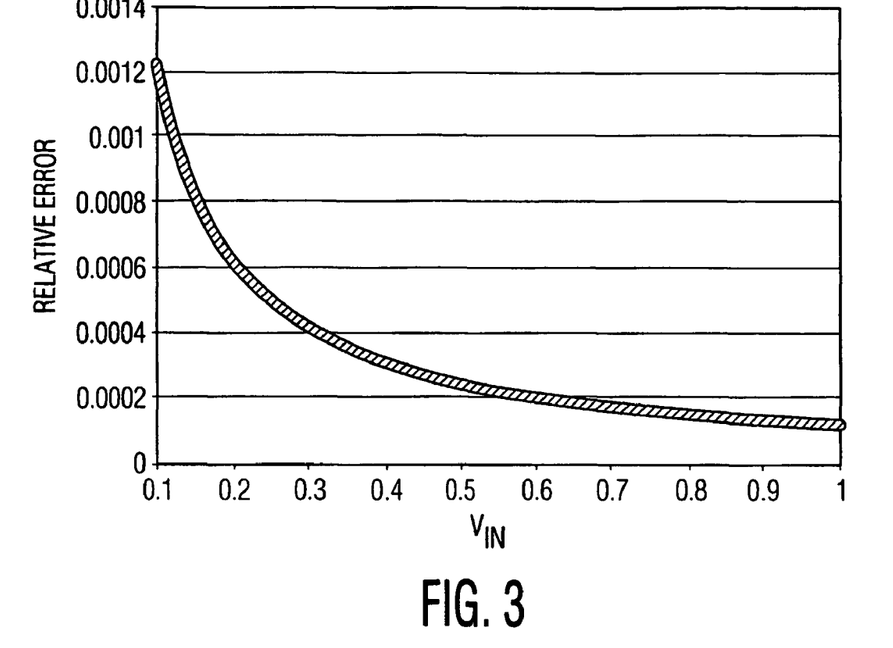
FIG. 3 depicts relative error versus input voltage for the linear A/D converter of FIG. 1 using 10 output bits, in accordance with embodiments of the present invention.

FIG. 3 depicts Relative Error versus input voltage VIN for the linear A/D converter 10 of FIG. 1 using 10 output bits, in accordance with embodiments of the present invention.

FIG. 3 shows that the relative error monotonically increases as VIN decreases and rapidly increases as VIN approaches 0.1. The relative error becomes infinite as VIN approaches 0, which is characteristic of both linear and non-linear A/D converters.

While FIGS. 1-3 depict a two-bit output code associated with the linear A/D converter 10, the following discussion pertains generally to a X-bit output code of a linear converter, wherein X$^3$2. Defining N=2X−1, there are 2X resistors in series each having a same resistance R, the 2X resistors being disposed in series between the lowest voltage VREF− and the highest voltage VREF+ as depicted in FIG. 1 for the case of X=2. There are N reference voltages V1, V2, . . . , VN linearly distributed between the lowest voltage VREF− and the highest voltage VREF+. Similarly, there are N comparators. There are 2X voltage steps from VREF− to VREF+ is, so that the number of voltage steps is 1 plus the number of comparators or reference voltages. The voltage step between any two consecutive reference voltages or between V1 and VREF− or between VREF+ and VN is (VREF+−VREF−)/2X. The absolute error is constant and is (VREF+−VREF−)/2X+1. The relative error is (VREF+−VREF−)/(VIN*2X+1) which increases as VIN decreases and becomes infinite as VIN approaches zero. The slope of the curve of relative error versus VIN varies as 1/VIN2 which explains the extremely adverse behavior of the relative error as VIN approaches 0.1 and lower values in FIG. 3.

Reducing the relative error at low values of VIN may be accomplished by increasing X which increases the number of resistors and associated reference voltages and comparators. If maximum relative error E and an input range of VMIN to VMAX is assumed for VIN such that 0<VMIN<VMAX and VMIN£VIN£VMAX, then the required number of output bits X can be computed. To ensure that the maximum error ε is not exceeded at the most critical point (i.e. when VIN is close to VMIN), a maximum reference voltage step size is 2εVMIN. The minimum number XMIN of output bits required is therefore:

$$XMIN = 1n[(VMAX-VMIN)/(2\epsilon VMIN)]/1n\ 2 \qquad (1)$$

If XMIN does not have an integer value when computed from Equation (1), then XMIN must be rounded upward to the next integer value. As an a example, a linear flash A/D converter, which should have a relative error no greater than 0.2% in the input range of 0.1 to 1 volt, must generate at least a 12 bit digital output, which requires 4095 comparators (i.e., 212−1) or 4096 reference voltage steps; i.e., VMIN=VREF−=0.1 volt, VMAX=VREF+=1 volt, and ε=0.002. Substituting the preceding values of VMIN, VMAX, and ε into Equation (1) yields XMIN=11.14, which rounds upward to XMIN=12. As shown in FIG. 3, the maximum relative error is approximately 0.0012 which is less than the specified 0.002, due to the upward rounding, which is a lower relative error than is required. If VIN is near VMAX=1.0, then the relative error is approximately 0.00011 which is much lower than is required.

Figure 4:
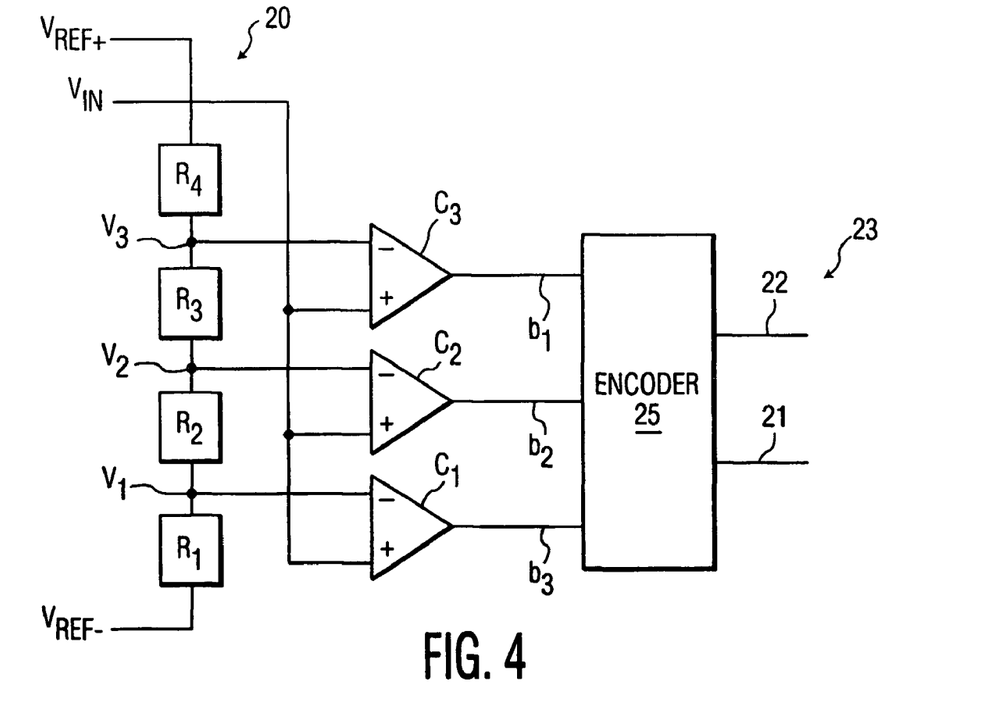
FIG. 4 depicts a non-linear flash-type A/D converter, in accordance with embodiments of the present invention.

FIG. 4 depicts a non-linear flash-type A/D converter 20 having a two-bit digital output code 23, as determined from the output bits 21 and 22 each containing a binary bit of 0 or 1, in accordance with embodiments of the present invention. The output code 23 (bit 21, bit 22) sequenced from left to right. For example, if bit 21 and bit 22 respectively contain 1 and 0, then the output code 23 is 10 b (binary), which is equivalent to 2 d (decimal).

Being a non-linear converter, the A/D converter 20 comprises four resistors in series having resistances R1, R2, R3, and R4, wherein R1, R2, R3, and R4 do not all have the same resistance value. Thus, the resistances R1, R2, R3, and R4 are non-linearly distributed between the lowest voltage VREF− and the highest voltage VREF+. This defines three reference voltages V1, V2, and V3 and four voltage steps such that VREF−<V1<V2< . . . <VN<VREF+. The four voltage steps of (V1−VREF−), (V2−V1), (V3−V2), and (VREF+−V3) do not all have the same value due to the non-linearity of the A/D converter 20, and the three reference voltages V1, V2, and V3 are said to be non-linearly distributed between the lowest voltage VREF− and the highest voltage VREF+.

The non-linear A/D converter 20 further comprises three comparators C1, C2, and C3, respectively associated with the three reference voltages V1, V2, and V3. The comparator C1 compares the input voltage VIN with the reference voltage V1 and outputs a binary bit b1 that reflects the result of said comparison (e.g., b1=0 if VIN<V1 and b1=1 if VIN³ V1). The comparator C2 compares the input voltage VIN with the reference voltage V2 and outputs a binary bit b2 that reflects the result of said comparison (e.g., b2=0 if VIN<V2 and b2=1 if VIN³ V2). The comparator C3 compares the input voltage VIN with the reference voltage V3 and outputs a binary bit b3 that reflects the result of said comparison (e.g., b3=0 if VIN<V3 and b3=1 if VIN³ V3).

The non-linear A/D converter 20 additionally comprises an encoder 25 which generates the output code 23 defined by the bits 21 and 22, from an analysis of b1, b2, and b3. The output code 23 may have one of four possible values, namely 00 $b$, 10 $b$, 01 $b$, and 11 $b$, wherein "b" stands for binary.

Figure 5:
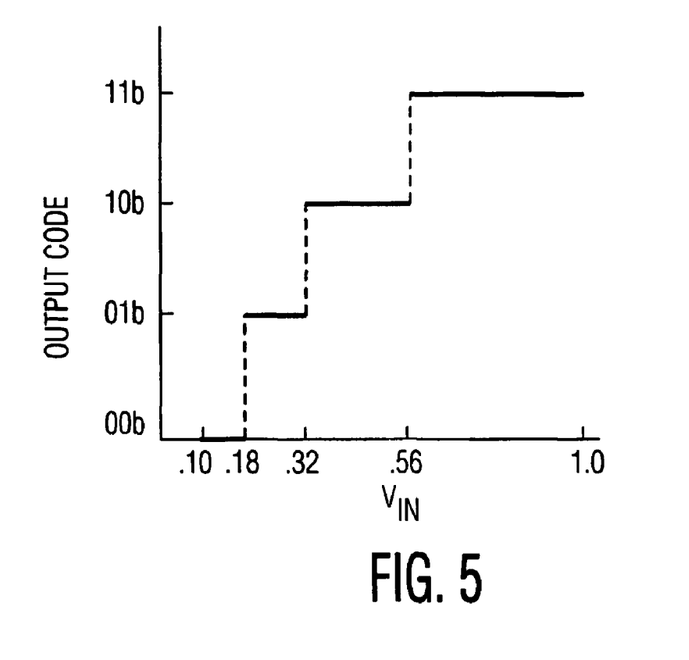
FIG. 5 depicts digital output versus input voltage for a geometric A/D converter, in accordance with embodiments of the present invention.

A particular type of non-linear A/D converter is a geometric A/D converter (alternatively called a "logarithmic" A/D converter) characterized by the constancy of the ratio of successive values of reference voltage. Thus if FIG. 4 represents a geometric A/D converter, then VREF+/V3=V3/V2=V2/V1=V1/VREF−=C=constant=(VREF+/VREF−)¼. In the numerical example discussed supra in conjunction with FIGS. 1-3 (i.e., VMIN=VREF−=0.1 volt, VMAX=VREF+=1 volt, and $\epsilon$=0.002), the geometric A/D converter is characterized by: C=(1.0/0.1)¼=1.778, V1=C*VREF−=0.1778, V2=C*V1=0.3162, V3=C*V=05623. FIG. 5 is a plot of output code 23 versus the input voltage VIN assuming the preceding example for the geometric A/D converter with VIN defined over a range from 0 to 1 (i.e., VREF−=0 and VREF+=1). Accordingly, FIG. 5 shows the four unequal voltage steps from 0.10 to 0.18, from 0.18 to 0.32, from 0.32 to 0.56, and from 0.56 to 1.0. The four output codes are summarized in Table 2, wherein "b" and "d" in the "Output Code" column stand for binary and decimal, respectively.

TABLE 2

| Output Code | Range of VIN |
|---|---|
| 00b = 0d | 0.10 £ VIN < 0.18 |
| 01b = 1d | 0.18 £ VIN < 0.32 |
| 10b = 2d | 0.32 £ VIN < 0.56 |
| 11b = 3d | 0.56 £ VIN < 1.0 |

While FIGS. 4-5 depict a two-bit output code associated with the non-linear A/D converter 20, the following discussion pertains generally to a X-bit output code of a non-linear converter, wherein X³2. Defining N=2X−1, there are 2X resistors having resistances R1, R2, . . . , RN+1 in series, between the lowest voltage VREF− and the highest voltage VREF+ as depicted in FIG. 4 for the case of X=2. There are N reference voltages V1, V2, . . . , VN non-linearly distributed between the lowest voltage VREF− and the highest voltage VREF+. Similarly, there are N comparators. There are 2X voltage steps from VREF− to VREF+ is 2X, so that the number of voltage steps is 1 plus the number of comparators or reference voltages. The voltage step between any two consecutive reference voltages or between V1 and VREF− or between VREF+ and VN is variable in that at least one of said voltage steps differs from at least one other of said voltage steps. If the non-linear A/D converter 20 is a geometric A/D converter, then the relative error E is constant (i.e., independent of VIN) and is given by:

$$E=(C-1)/2 \quad (2)$$

wherein $$C=(VREF+/VREF-)1/N \quad (3)$$

However, N is not arbitrary and must satisfy the following equation if the maximum relative error $\epsilon$ is specified:

$$(VREF+/VREF-)1/N £ 1+2\epsilon \quad (4)$$

from which N may be calculated as:

$$N=1n(VREF+/VREF-)/1n(1+2\epsilon) \quad (5)$$

Figure 6:
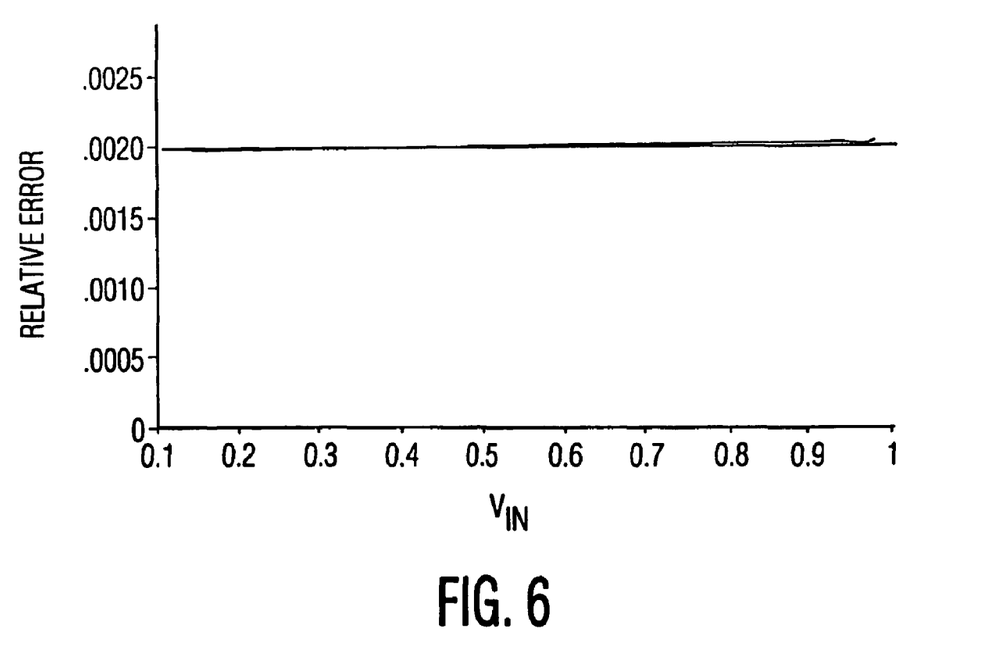
FIG. 6 depicts relative error versus input voltage for the geometric A/D converter of FIG. 5, in accordance with embodiments of the present invention.

If N in Equation (5) is not an integer, then N must be rounded upward to the next integer. For the current example and using Equation (5), N=1n(1.0/0.1)/1n(1+2*0.002) =576.8 which rounds upward to N=577 from which C=(1/0.1)1/577=1.004 from Equation (3). As a check, Equation (2) yields E=0.002. The constant relative error of E=0.002 is plotted in FIG. 6. It should be noted that the geometric A/D converter cannot process VREF−=0, since the number N of required reference voltage steps becomes infinite as VREF− approaches 0 as may be inferred from Equation (5).

A geometric A/D converter results in unpractical fractional output values, with consequent increased complexity of the encoder 25. A more practical approach is to use the design of the linear flash A/D converter, and to leave out those voltage comparisons that are not required such as inter alia by omitting resistors or comparators or both. A comparison may be left out if omission of the comparison does not result in a relative error exceeding a given maximum relative error $\epsilon$. Any algorithm leaving out comparisons could be utilized if such an algorithm would be known or obvious to a person of ordinary skill in the art.

Figure 7:
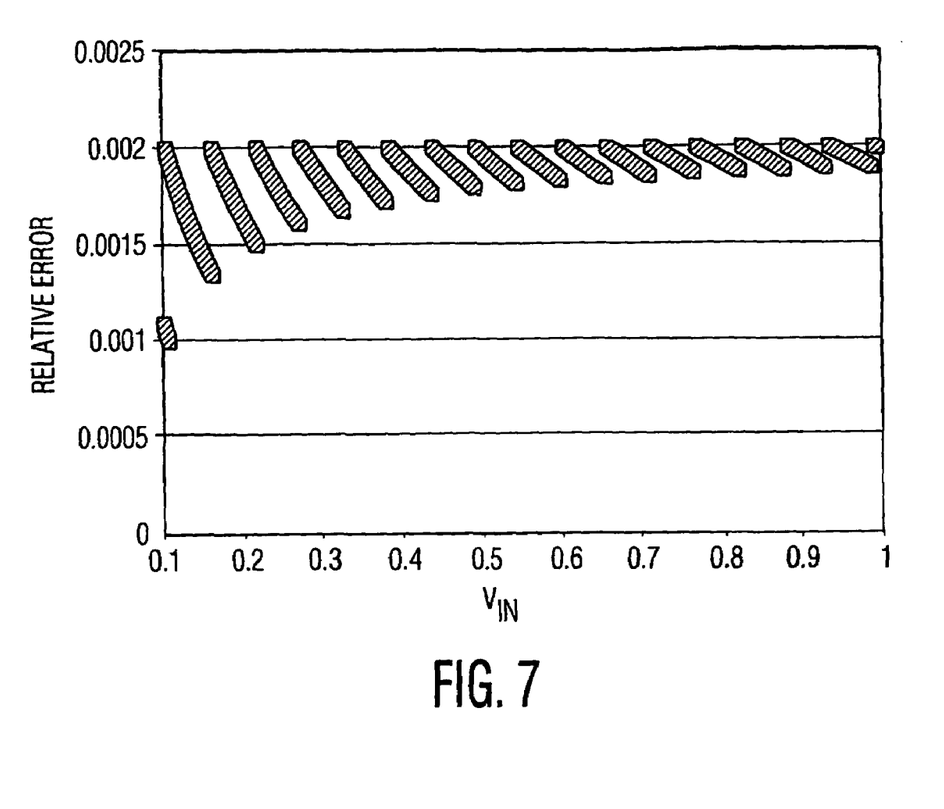
FIG. 7 depicts relative error versus input voltage for the linear A/D converter of FIG. 1 with unnecessary reference voltage steps removed, in accordance with embodiments of the present invention.

One such algorithm that has been used requires only 659 steps to meet the conditions of the example of FIGS. 1-3 (i.e., VMIN=VREF−=0.1 volt, VMAX=VREF+=1 volt, and $\epsilon$=0.002). This compares quite favorably with the 4096 reference voltage steps required for the pure linear A/D converter discussed supra in conjunction with FIGS. 1-3. The effect of this algorithm on the relative error as a function of the input voltage VIN is illustrated in FIG. 7. In FIG. 7, the relative error is a piecewise continuous function of VIN the range of VREF− £VIN £VREF+. This piecewise continuous function of VIN has a plurality of pieces, wherein each two consecutive pieces of the plurality of pieces are discontinuously joined together. The relative error within each said piece is a monotonically decreasing function of VIN. In FIG. 7, each such piece of the plurality of pieces has about a same maximum relative error, namely about 0.002.

The result of using the algorithm associated with FIG. 7 is having a nonlinear A/D converter with a dynamic voltage range comparable with that of a 12-bit linear A/D converter, but with the complexity roughly comparable to that of an 10-bit converter (i.e., 659 steps is between 29 and 210 steps, so 659 is rounded up to 210). Not taken into account is the slightly more complex digital encoder 25 (see FIG. 4) function required to convert the 658 output bits from the comparators to a 12-bit output value, and the analog requirements applicable to the reference voltages and comparators that are comparable to those of a 12-bit linear A/D converter.

Other embodiments have the non-linear A/D converter 20 of FIG. 4 structured as having a plurality of linear ranges. For example for a positive integer M in the range of 1<M<N where N is the total number of reference voltage steps in the non-linear A/D converter 20, the reference voltages V1, V2, ..., VM−1 may be linearly distributed between VREF− and VM with a reference voltage step size ΔV1, and the reference voltages VM+1, ..., VN may be linearly distributed between VM and VREF+ with a reference voltage step size ΔV2, wherein ΔV1<ΔV2. As a more general example, the plurality of linear ranges may comprise L linear ranges such that $L \geq 2$, with the linear ranges in increasing order of voltage from VREF− to VREF+ having reference voltage step sizes ΔV1, ΔV2, ..., ΔVL from VREF− to VREF+, subject to ΔV1<ΔV2< ... <ΔVL. In these other embodiments, unnecessary voltage comparisons may be left out of some or all of the linear ranges as explained supra in conjunction with FIG. 7.

In another embodiment, the reference voltages V1, V2, ..., VM−1 are linearly distributed between VREF− and VM with a reference voltage step size ΔV, and the reference voltages VM+1, ..., VN are non-linearly (e.g., geometrically) distributed between VM and VREF+, wherein 1<M<N. In this another embodiment, unnecessary voltage comparisons may be left out of the linear and/or non-linear ranges as explained supra in conjunction with FIG. 7.

The preceding discussions of the various non-linear A/D converter embodiments may be summarized as follows. A flash-type A/D converter is adapted to convert an input voltage VIN to a digital output, wherein VIN is within a working voltage range of the A/D converter. The working voltage range defined by a lowest voltage VREF− and a highest voltage VREF+. The A/D converter comprises: N reference voltages ($N \geq 3$), N comparators, and an encoder. The N reference voltages are denoted as V1, V2, ..., VN and are non-linearly distributed between VREF− and VREF+ and ordered according to VREF−<V1<V2< ... <VN<VREF+. The N comparators are associated with the N reference voltages on a one-to-one basis. Each comparator is adapted to make a comparison between VIN and the reference voltage that is associated with the comparator, and each comparator comprises bit-generating means for generating a binary bit that reflects a binary result of said comparison. The encoder means is for generating the digital output from an analysis of the binary bits generated by the bit-generating means.

Figure 8:
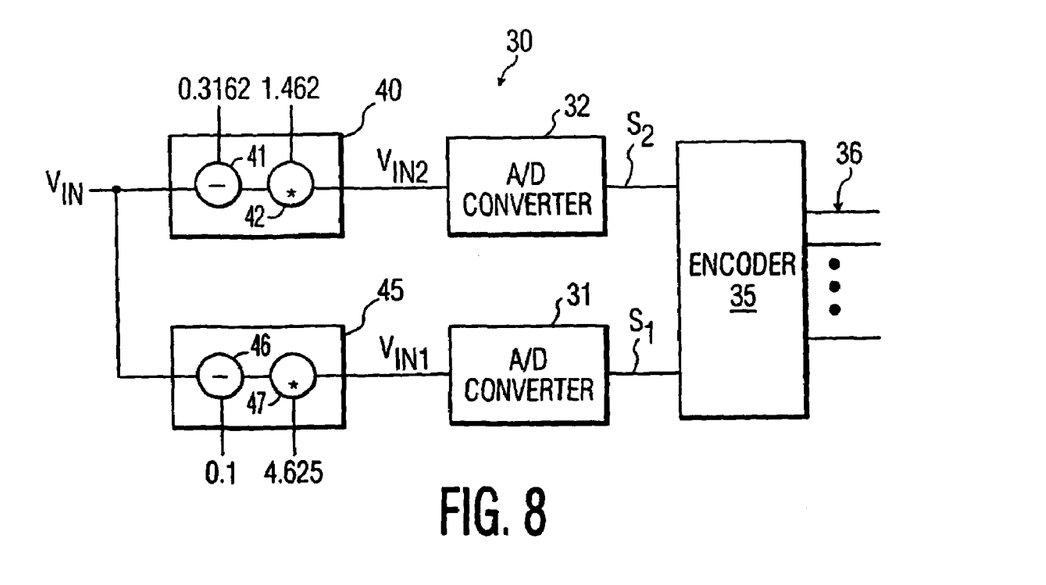
FIG. 8 depicts a first system comprising two linear flash-type A/D converters, in accordance with embodiments of the present invention.
Figure 9:
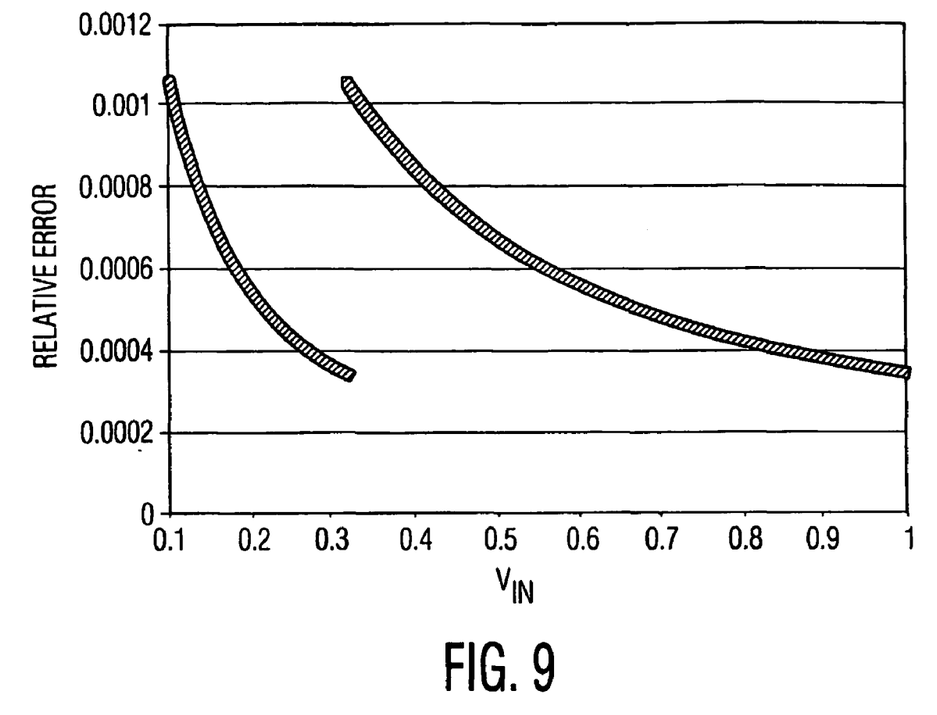
FIG. 9 depicts relative error versus input voltage for the first system of FIG. 8, in accordance with embodiments of the present invention.
Figure 10:
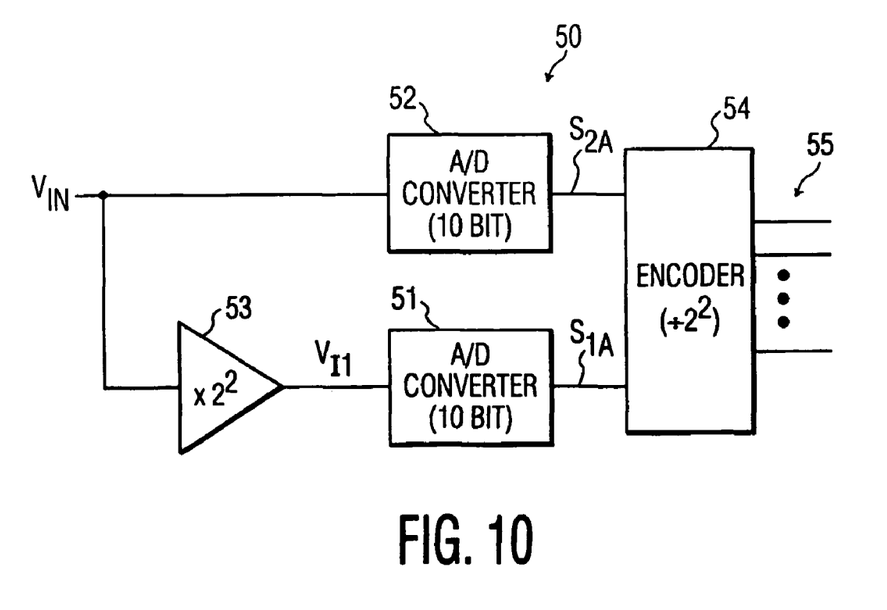
FIG. 10 depicts a second system comprising two flash-type linear A/D converters, in accordance with embodiments of the present invention.
Figure 11:
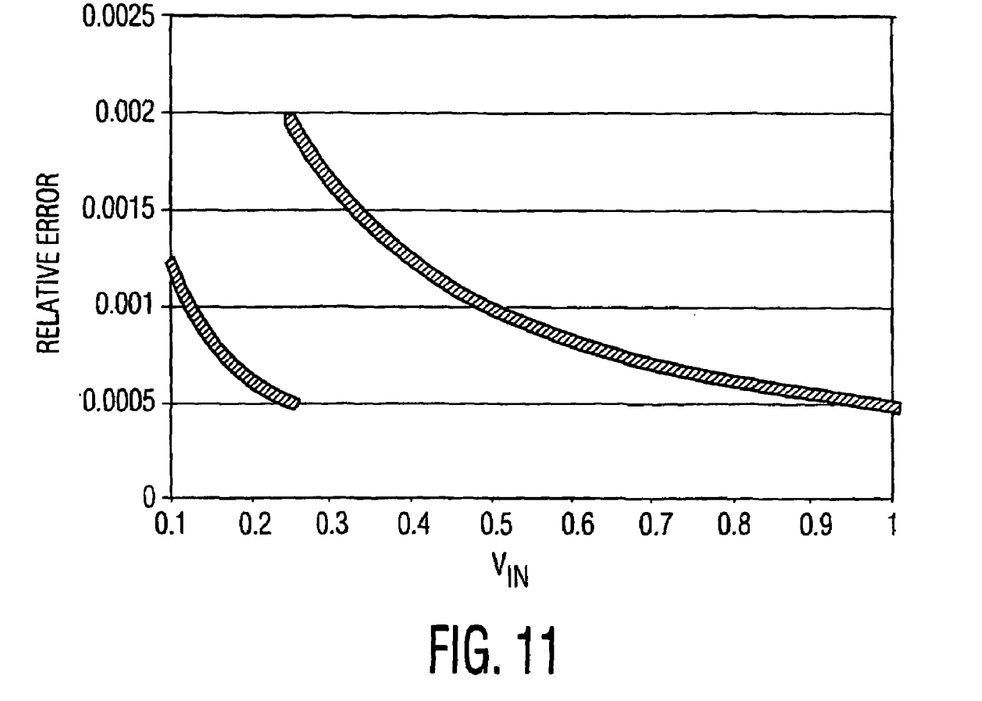
FIG. 11 depicts relative error versus input voltage for the second system of FIG. 10, in accordance with embodiments of the present invention.
Figure 12:
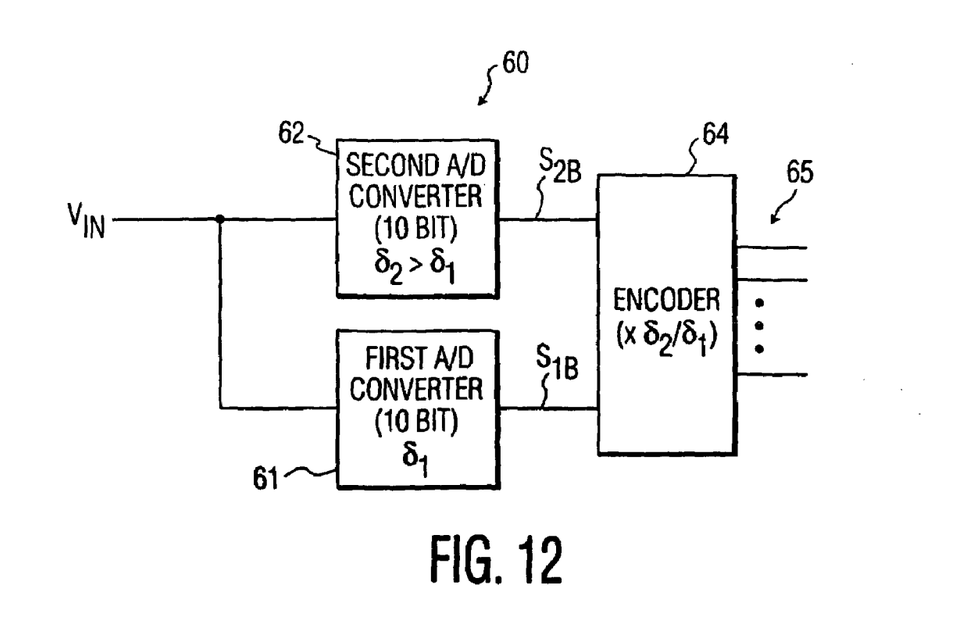
FIG. 12 depicts a third system comprising two flash-type linear A/D converters, in accordance with embodiments of the present invention.
Figure 13:
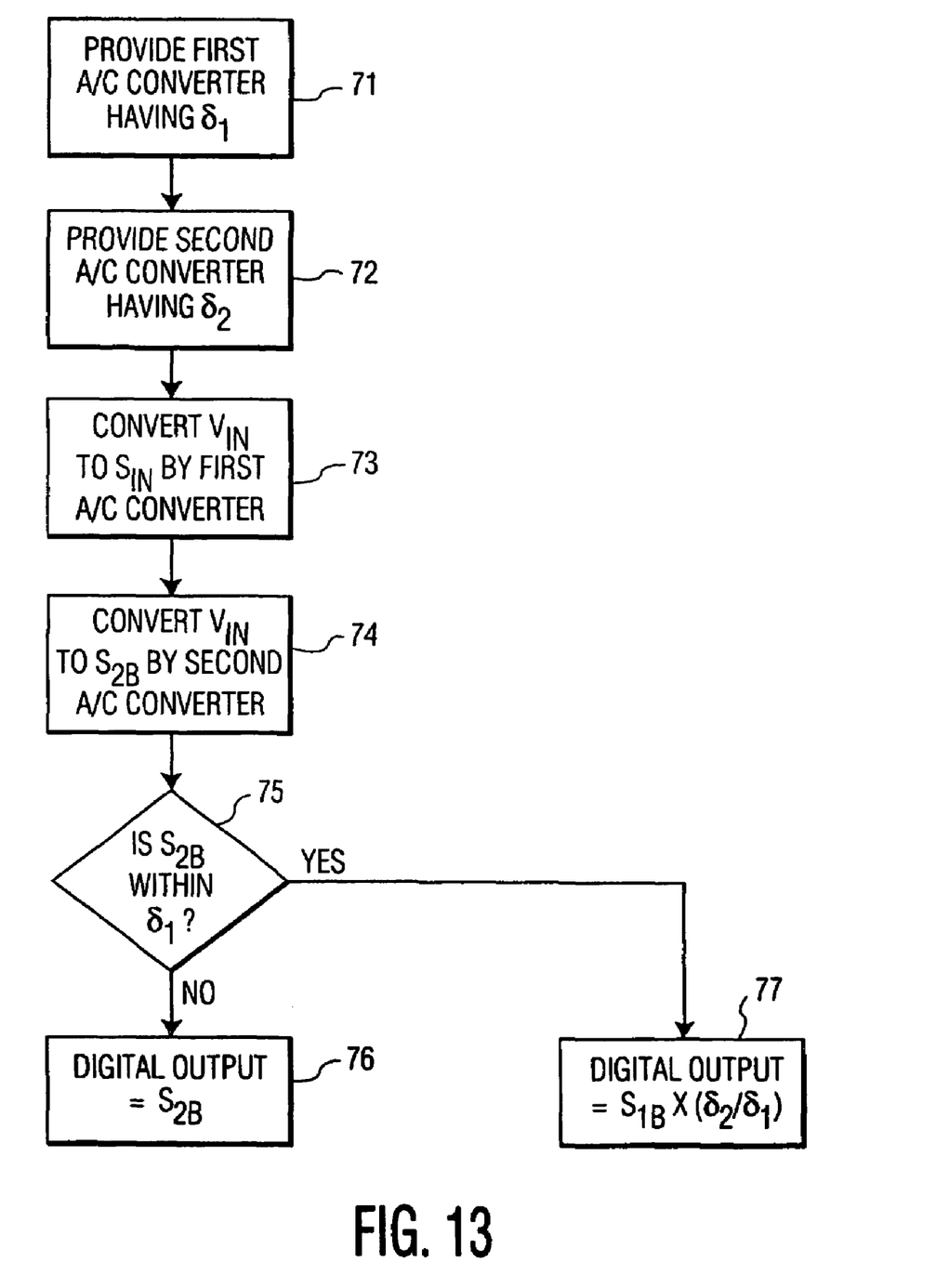
FIG. 13 is a flow chart depicting conversion of an input voltage to a digital output by the third system of FIG. 12, in accordance with embodiments of the present invention.

FIGS. 8-13 depict the use of a plurality of linear flash-type A/D converters, in accordance with embodiments of the present invention. FIGS. 8-9 depict a first embodiment of this type. FIGS. 10-11 depict a second embodiment of this type. FIGS. 12-13 depict a third embodiment of this type.

FIG. 8 depicts a system 30 comprising linear flash-type A/D converters 31 and 32, in accordance with embodiments of the present invention. The A/D converters 31 and 32 each process a different range of input voltage, but each have a same working range of voltage. An arithmetic unit 45 linearly transforms input voltage VIN to voltage VIN1, and the A/D converter 31 converts the voltage VIN1 into a multibit string S1. The arithmetic unit 45 comprises a subtractor 46 and a multiplier 47. The combination of the A/D converter 31 and the arithmetic unit 45 is called herein an A/D converter apparatus Z1. An arithmetic unit 40 linearly transforms input voltage VIN to voltage VIN2, and the A/D converter 32 converts the voltage VIN2 into a multibit string S2. The arithmetic unit 40 comprises a subtractor 41 and a multiplier 42. The combination of the A/D converter 32 and the arithmetic unit 40 is called herein an A/D converter apparatus Z2. The strings S1 and S2 may each have a same number of bits or alternatively may have a different number of bits.

An encoder 35 combines the multibit strings S1 and S2 into the digital output 33. The encoder 35 transforms the multibit strings S1 and S2 so as to effectively invert the numerical operations of the arithmetic units 45 and 40. Thus inverting S1 involves dividing by 4.625 followed by adding 0.1. Inverting S2 involves dividing by 1.462 followed by adding 0.3162. The digital output 33 has a sufficient number of bits to preserve the accuracy that is contained within each of S1 and S2. Thus, the digital output 33 has more bits than either of S1 and S2.

The example illustrated in FIG. 8 splits the VIN range of 0 to 1 volts into two voltage subranges δV1 and δV2. The A/D converters 31 and 32 themselves have a working voltage range from 0 to 1 volt in this example. The subrange δV1 is from 0.10 to 0.3162 volts, and the subrange δV2 is from 0.3162 to 1 volt. The preceding numerical values for δV1 and δV2 are optimizing values which constrain the maximum relative error ε1 of subrange δV1 to have the same value as the maximum relative error ε2 of subrange δV2. Noting that X represents the same number of voltage steps in subranges δV1 and δV2, and defining a cutoff voltage VC that interfaces subrange δV1 with δV2, it follows that [(VC−0.1)/0.1]/2X+1 and ε2=[(1−VC)/VC]/2X+1. Setting ε1=ε2 and solving for VC yields VC=1/$(10)^{1/2}$=0.3162, which defines the aforementioned numerical values for the subranges δV1 and δV2. In FIG. 8, the arithmetic unit 45 effectuates VIN1=(VIN−0.1) *4.625, which transforms the subrange δV1 of 0.10 to 0.3162 volts to the working voltage range of 0 to 1 volts of the A/D converter 31. Also in FIG. 8, the arithmetic unit 40 effectuates VIN2=(VIN−0.3162)*1.462, which transforms the subrange δV2 of 0.3162 to 1 volt to the working voltage range of 0 to 1 volts of the A/D converter 32.

FIG. 9 depicts relative error of the digital output 36 versus input voltage VIN for the system 30 of FIG. 8 using the preceding example with a maximum relative error of 0.002 for each of the subranges δV1 and δV2. FIG. 9 shows that the maximum relative error of the digital output 36 is only 0.001 which demonstrates the improvement (as compared with 0.002) obtained by using two A/D converters instead of one A/D converter. With the maximum relative error of 0.002 in each of δV1 and δV2, the multibit strings S1 and S2 must each have at least 10 bits. The encoder 35 generates a 12-bit result for the digital output 36. As a result of the preceding transformations of VIN to VIN1 and VIN2, the subranges δV1 and δV2 have effective reference voltage step sizes of ΔV1 and ΔV2 in the ratio of approximately ΔV1/ΔV2=0.3162/(1−0.3162)=0.46, which follows the general relationship of ΔV1<ΔV2.

The embodiments of FIGS. 8-9 applies generally to K linear flash-type A/D converter apparatuses Z1, Z2, ..., ZK respectively characterized by reference voltage step sizes ΔV1, ΔV2, ..., ΔVK and respectively adapted to convert VIN into multibit strings S1, S2, ..., SK, wherein ΔV1<ΔV2< ... <ΔVK, and wherein $K \geq 2$. An encoder combines S1, S2, ..., and SK to generate the digital output, wherein the digital output has a sufficient number of bits to preserve the accuracy that is contained within S1, S2, ..., and SK. For k=1, 2, ..., K, the A/D converter apparatus Zk comprises an arithmetic unit Ak in series with an A/D converter Bk. The A/D converters have the same working voltage range and VIN is within this working voltage range. The working voltage range comprises K contiguous voltage subranges denoted as δV1, δV2, ..., δVK in order of lower to higher voltages. For k=1, 2, ..., K, the arithmetic unit Ak is adapted to change VIN into a new input voltage VIN,k in accordance with a transformation of δVk into the working voltage range, and A/D converter Bk is adapted to transform VIN,k into the multibit string Sk.

Although the embodiment of FIGS. 8 and 9 generated the subranges δV1 and δV2 based on an optimization algorithm, the subranges δV1 and δV2 may be based on a voltage division that is less than optimal in terms of relative error, but simplifies the encoder significantly, as illustrated in embodiments of the present invention depicted in FIGS. 10-13. FIGS. 10-13 include two variants based on the same idea, namely the embodiment of FIGS. 10-11 and the embodiment of FIGS. 12-13.

FIG. 10 depicts a system 50 comprising linear flash-type A/D converters 51 and 52, in accordance with embodiments of the present invention. The A/D converters 51 and 52 each process a different range of input voltage, but each have a same working range of voltage. An arithmetic unit 53 linearly amplifies input voltage VIN to voltage V1 by a factor of 22 and the A/D converter 51 converts the voltage V1 into a multibit string S1A. The A/D converter 52 converts the input voltage VIN to a multibit string S2A. The combination of the A/D converter 51 and the arithmetic unit 53 is called herein an A/D converter apparatus. The strings S1A and S2A may each has a same number of bits as shown or alternatively a different number of bits.

For a given input voltage VIN, either: the A/D converter 51 is used to generate the multibit string S1A, or the A/D converter 52 is used to generate the multibit string S2A, depending on the magnitude of VIN. Assuming that both VIN has an input range of 0 to 1 volt, and that the A/D converters 51 and 52 themselves each have a working voltage range from 0 to 1 volt, then the A/D converter 51 is used if VIN<1/22, and the A/D converter 52 is used if VIN$^3$ 1/22. The effect of multiplying VIN by 22 if VIN<1/22 reduces the relative error by a factor of 22 if VIN<1/22.

An encoder 54 selects the multibit string S1A or S2A to generate the digital output 55, depending on whether the A/D converter 51 or 52 was used. The encoder 55 transforms the multibit string S1A so as to effectively invert the numerical operations of the arithmetic units 53. Thus inverting S1A involves dividing by 22 as shown in FIG. 10. The digital output 55 has a sufficient number of bits to preserve the accuracy that is contained within each of S1 and S2.

FIG. 11 illustrates the relative error in the digital output 55 versus VIN for the embodiment of FIG. 10 with the illustrated numerical example. FIG. 11 shows that as VIN varies from 0 to 1, the relative error increases by an expected factor of about 22 at VIN=22 as the transition is made from using the A/D converter 51 to using the A/D converter 52 as described supra.

Although in FIG. 10 the arithmetic unit 53 multiplies VIN by 22, the arithmetic unit 53 or an equivalent thereof may multiply VIN by 2J wherein J is a positive integer. Generally, the arithmetic unit 53 or an equivalent thereof may multiply VIN by any real number R that exceeds 1 providing that the encoder 54 effectuates a proper inversion of VIN with respect to R. The encoder 54 will increase in complexity if said multiplication is by a real number R that differs from 2J wherein J is a positive integer. As a result of the preceding processing, the A/D converters 51 and 52 have reference voltage step sizes of ΔV1 and ΔV2, respectively, such that ΔV1<ΔV2.

FIG. 12 depicts a system 60 comprising a first linear flash-type A/D converter 61 and a second linear flash-type A/D converter 62, in accordance with embodiments of the present invention. The system 60 of FIG. 12 generates the same relative error curve of FIG. 11 as does the system 50 of FIG. 10. The A/D converters 61 and 62 have a working voltage range of δ1 and δ2, respectively, wherein δ1/δ2=1/22. Thus if the A/D converter 62 processes voltages from 0 to 1 volt, then δ2=1 volt and δ1=1/22 volts. The input voltage VIN is processed by both A/D converters 61 and 62. The A/D converter 61 converts VIN into a multibit string S1B. The A/D converter 62 converts the input voltage VIN to a multibit string S2B. The strings S1A and S2B may each have a same number of bits as shown or alternatively a different number of bits.

An encoder 64 selects the multibit string S1B or S2B, depending on the value of S2B, to generate the digital output 65. If S2B is not within δ1, then the encoder 64 selects S2B; otherwise the encoder 64 selects S1B. The encoder 65 multiplies the multibit string S1B by δ2/δ1. The digital output 65 has a sufficient number of bits to preserve the accuracy that is contained within each of S1 and S2. The effect of reducing the working voltage range of the A/D converter 61 relative to that of the A/D converter 62 reduces the relative error by a factor of 22 if VIN<1/22.

FIG. 13 is a flow chart depicting operation of the system 60 of FIG. 12, in accordance with embodiments of the present invention. In steps 71 and 72, the first A/D converter 61 (with working voltage range δ1) and the second linear A/D converter 62 (with working voltage range 62) are respectively provided. In step 73, VIN is converted to S1B by the first A/D converter 61. In step 74, VIN is converted to S2B by the second A/D converter 62. Step 75 queries whether S2B is within δ1. If NO, then the encoder 64 generates the digital output 65 from S2B in step 76. If YES, then the encoder 64 generates the digital output 65 from S1B×(δ2/δ1) in step 77.

FIG. 11, which was applied supra to the system 50 of FIG. 10, likewise applies to the system 60 for displaying the relative error in the digital output 65 versus VIN with the illustrated numerical example. In relation to FIGS. 12-13, FIG. 11 shows that as VIN varies from 0 to 1, the relative error increases by an expected factor of about 22 at VIN=22 as the transition is made from S2B not within δ1 to S2B within δ1.

Although δ1/δ2=1/22 in the illustrated numerical example in FIGS. 12-13, δ1/δ2 may be of the form ½J wherein J is a positive integer. Generally, δ1/δ2 may be any real number R that exceeds 1 providing that the encoder 64 effectively multiplies S1B by R. The encoder 64 will increase in complexity if δ1/δ2 is a real number R that differs from 2J wherein J is a positive integer. As a result of the preceding processing, the A/D converters 51 and 52 have reference voltage step sizes of ΔV1 and ΔV2, respectively, such that ΔV1<ΔV2.

The embodiments of FIGS. 8-13 applies generally to K linear flash-type A/D converter apparatuses Z1, Z2, ..., ZK respectively characterized by reference voltage step sizes ΔV1, ΔV2, ..., ΔVK and respectively adapted to convert VIN into multibit strings S1, S2, ..., SK, wherein ΔV1<ΔV2< ... <ΔVK, and wherein K$^3$2. An encoder combines S1, S2, ..., and SK to generate the digital output, wherein the digital output has a sufficient number of bits to preserve the accuracy that is contained within S1, S2, ..., and SK.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A system for converting an input voltage VIN to a digital output, comprising: K linear flash-type analog-to-digital (A/D) converter apparatuses Z1, Z2, . . . , ZK respectively characterized by reference voltage step sizes $\Delta V1, \Delta V2, \ldots, \Delta VK$ and respectively adapted to convert VIN into multibit strings S1, S2, . . . , SK, wherein $\Delta V1<\Delta V2< \ldots <\Delta VK$, and wherein K is greater than or equal to 2; and encoder means for applying multiplying or dividing at least a selected one of S1, S2, . . . , and SK by a value to generate the digital output, wherein the digital output has a sufficient number of bits to preserve the accuracy that is contained within S1, S2, . . . , and SK.

2. The system of claim 1, wherein S1, S2, . . . , and SK each have a same number of bits.

3. The system of claim 1, wherein S1, S2, . . . , and SK do not each have a same number of bits.

4. The system of claim 1, wherein for k-1, 2, . . . , K the A/D converter apparatus ZK comprises an arithmetic unit Ak in series with an A/D converter Bk, wherein the A/D converters have a same working voltage range, wherein VIN is within the working voltage range, wherein the working voltage range comprises K contiguous voltage subranges denoted as $\delta V1, \delta V2, \ldots, \delta VK$ in order of lower to higher voltages, wherein for k=1, 2, . . . , K the arithmetic unit Ak is adapted to change VIN into a new input voltage VIN, k in accordance with a transformation of $\delta Vk$ into the working voltage range and A/D converter Bk is adapted to transform VIN, k into the multibit string Sk.

5. The system of claim 4, wherein $\delta V1, \delta V2, \ldots, \delta VK$ have values such the error of the digital output relative to VIN is a piecewise continuous function of VIN within the working voltage range, said piecewise continuous function of VIN, the piecewise continuous function having K pieces, wherein the relative error within each said piece of the K pieces is a monotonically decreasing function of VIN, and wherein each piece of the K pieces has about a same maximum relative error.

6. The system of claim 1, wherein K=2, wherein the A/D converter apparatuses Z1 and Z2 comprise A/D converters B1 and B2 having working voltage ranges $\delta 1$ and $\delta 2$, respectively, such that $\delta 2$ is a subset of $\delta 1$ and $\delta 2/\delta 1$ is an integer subject to $\delta 2/\delta 1>1$, wherein B1 and B2 are respectively adapted to convert VIN to S1 and S2, and wherein the encoder means is adapted to generate the digital output as S2 if S2 is not within the voltage range $\delta 1$ else the encoder means is adapted to generate the digital output as S1 multiplied by $\delta 2/\delta 1$.

7. The system of claim 6, wherein $\delta 2/\delta 1=2J$, and wherein J is a positive integer.

8. A method for converting an input voltage VIN to a digital output, comprising: providing K linear flash-type analog-to-digital (A/D) converter apparatuses Z1, Z2, . . . , ZK respectively characterized by reference voltage step sizes $\Delta V1, \Delta V2, \ldots, \Delta VK$, wherein $\Delta V1<,\Delta V2< \ldots <\Delta VK$, and wherein K is greater than or equal to 2; convening VIN, by converter apparatuses Z1, Z2, . . . , ZK, into multibit strings S1, S2, . . . , SK, respectively; and multiplying or dividing at least a selected one of S1, S2, . . . , and SK by a value to generate the digital output, wherein the digital output has a sufficient number of bits to preserve the accuracy that is contained within S1, S2, . . . , and SK.

9. The system of claim 8, wherein S1, S2, . . . , and SK each have a same number of bits.

10. The method of claim 8, wherein S1, S2, . . . , and SK do not each have a same number of bits.

11. The method of claim 8, wherein for k=1, 2, . . . , K the A/D converter apparatus Zk comprises an arithmetic unit Ak in series with an A/D converter Bk, wherein the A/D converters have a same working voltage range, wherein VIN is within the working voltage range, wherein the working voltage range comprises K contiguous voltage subranges denoted as $\delta V1, \delta V2, \ldots, \delta VK$ in order of lower to higher voltages, said method further comprising: changing VIN by the arithmetic unit Ak for k=1, 2, . . . , K, into a new input voltage VIN,k in accordance with a transformation of $\delta Vk$ into the working voltage range; and transforming VIN,k by the A/D converter Bk, into the multibit string Sk.

12. The method of claim 11, wherein $\delta V1, \delta V2, \ldots, \delta VK$ have values such the error of the digital output relative to VIN is a piecewise continuous function of VIN within the working voltage range, said piecewise continuous function of VIN, the piecewise continuous function having K pieces, wherein each two consecutive pieces of the K pieces are discontinuously joined together, wherein the relative error within each said piece of the K pieces is a monotonically decreasing function of VIN, and wherein each piece of the K pieces has about a same maximum relative error.

13. The method of claim 8, wherein K=2, wherein the A/D converter apparatuses Z1 and Z2 comprise A/D converters B1 and B2 having working voltage ranges $\Delta 1$ and $\Delta 2$, respectively, such that $\delta 2$ is a subset of $\delta 1$ and $\delta 2/\delta 1$ is an integer subject to $\delta 2/\delta 1>1$, wherein B1 and B2 are respectively adapted to convert VIN to S1 and S2, and wherein said combining includes generating the digital output as essentially S2 if S2 is not within the voltage range $\delta 1$ else said combining includes generating the digital output essentially as S1 multiplied by $\delta 2/\delta 1$.

14. The method of claim 13, wherein $\delta 2/\delta 1=2J$, and wherein J is a positive integer.

* * * * *